(12) United States Patent
Chen

(10) Patent No.: US 10,636,671 B1
(45) Date of Patent: Apr. 28, 2020

(54) PLANARIZATION PROCESS

(71) Applicant: UNITED MICROELECTRONICS CORP., Hsin-Chu (TW)

(72) Inventor: Ming-Shing Chen, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 16/296,243

(22) Filed: Mar. 8, 2019

(51) Int. Cl.
*H01L 21/3105* (2006.01)
*H01L 21/02* (2006.01)

(52) U.S. Cl.
CPC .. *H01L 21/31055* (2013.01); *H01L 21/02065* (2013.01); *H01L 21/02532* (2013.01)

(58) Field of Classification Search
None
See application file for complete search history.

(56) References Cited

U.S. PATENT DOCUMENTS

| | | | | | |
|---|---|---|---|---|---|
| 4,876,217 | A | * | 10/1989 | Zdebel | H01L 21/32 438/430 |
| 6,525,369 | B1 | * | 2/2003 | Wu | H01L 27/115 257/314 |
| 2005/0127473 | A1 | * | 6/2005 | Sakagami | H01L 21/76229 257/510 |
| 2007/0218629 | A1 | * | 9/2007 | Kronke | H01L 27/10858 438/257 |
| 2019/0148389 | A1 | * | 5/2019 | Lin | H01L 29/40114 257/508 |

OTHER PUBLICATIONS

Chen, Title of Invention: Semiconductor Fabrication Method, TW Application No. 107112941, Filing Date: Apr. 16, 2018.

* cited by examiner

*Primary Examiner* — Allan W. Olsen
(74) *Attorney, Agent, or Firm* — Winston Hsu

(57) ABSTRACT

A planarization process includes the following steps. A first dielectric layer and a second dielectric layer are sequentially formed to conformally cover a pattern in a cell area and a substrate in the cell area and an isolation area, thereby the first dielectric layer and the second dielectric layer having a dishing in the isolation area. A dummy material is formed in the dishing and exposes a part of the second dielectric layer right above the pattern. A first removing process is performed to remove the exposed part of the second dielectric layer. The dummy material is removed. A second removing process is performed to remove an exposed part of the first dielectric layer by using the second dielectric layer as an etch stop layer. A third removing process is performed to remove the second dielectric layer and the first dielectric layer.

20 Claims, 5 Drawing Sheets

PLANARIZATION PROCESS

BACKGROUND OF THE INVENTION

1. Field of the Invention

The present invention relates generally to a planarization process, and more specifically to a planarization process using a dummy material.

2. Description of the Prior Art

Communication of mass information is a regular part of modern life. Memory devices that access information are essential for managing such information efficiently. Flash memory, with its advantages of low power consumption, high-speed operation, being readable/writable, non-volatile, and requiring no mechanical operations, has been widely applied to personal computers and electronic apparatus, as operations of data writing, reading, and erasing can be performed repeatedly on a non-volatile memory device and the data stored therein will not be lost even when a power supply is turned off.

Flash memory includes a plurality of memory units, wherein each memory unit includes a specially made MOS (Metal-Oxide-Semiconductor) transistor. Each transistor includes a stacked gate having a floating gate and a control gate fabricated thereon. The control gate is disposed on the floating gate directly, the floating gate and the control gate are isolated by a dielectric layer, and the floating gate and the substrate are isolated by a tunneling oxide (this is known as a stacked gate flash memory). The transistor may have other assisting gates besides the floating gate and the control gate, and the memory unit may be integrated with transistors of logic units.

SUMMARY OF THE INVENTION

The present invention provides a planarization process, which applies dummy materials to fill dishings and remove protruding parts, thereby a planarization process can being improved.

The present invention provides a planarization process including the following steps. A substrate including a cell area and an isolation area is provided. A pattern is formed on the substrate of the cell area. A first dielectric layer and a second dielectric layer are sequentially formed to conformally cover the pattern and the substrate in the cell area and the isolation area, thereby the first dielectric layer and the second dielectric layer having a dishing in the isolation area. A dummy material is formed in the dishing and exposes a part of the second dielectric layer right above the pattern. A first removing process is performed to remove the exposed part of the second dielectric layer and thus expose a part of the first dielectric layer. The dummy material is removed. A second removing process is performed to remove the exposed part of the first dielectric layer by using the second dielectric layer in the isolation area as an etch stop layer. A third removing process is performed to remove the second dielectric layer and the first dielectric layer.

According to the above, the present invention provides a planarization process, which sequentially forms a first dielectric layer and a second dielectric layer conformally covering a pattern on a substrate in a cell area and the substrate in the cell area and an isolation area, thereby the first dielectric layer and the second dielectric layer inherently having a dishing in the isolation area; forms a dummy material in the dishing and exposes a part of the second dielectric layer right above the pattern; performs a first removing process to remove the exposed part of the second dielectric layer and thus expose a part of the first dielectric layer; removes the dummy material; performs a second removing process to remove the exposed part of the first dielectric layer by using the second dielectric layer as an etch stop layer, therefore a flat top surface constituted by said layers can being formed. Then, a third removing process can be performed to remove top parts of these layers such as the second dielectric layer and the first dielectric layer, to forma lower flat top surface. By doing this, the planarization process of present invention can obtain a flat top surface by utilizing the dummy material filling into the dishing.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
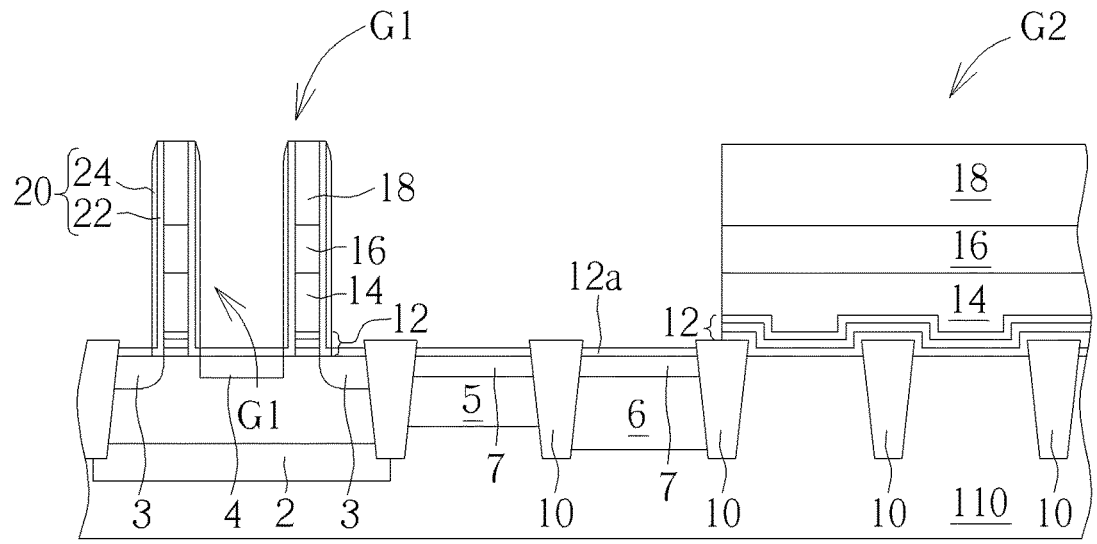
FIG. 1 schematically depicts a cross-sectional view of a planarization process according to an embodiment of the present invention.

FIGS. 1-9 schematically depict cross-sectional views of a planarization process according to an embodiment of the present invention. As shown in FIG. 1, the substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. The substrate 110 may be divided into several areas. In this embodiment, the substrate 110 includes a flash cell area A, an isolation area B and a core area C, but it is not limited thereto. The isolation area B may include a high voltage N-type MOS transistor area B1 and a high voltage P-type MOS transistor area B2, while the core area C may include a core N-type MOS transistor area C1 and a core P-type MOS transistor area C2, but it is not limited thereto. In this case, the flash cell area A is an embedded flash (e-flash) area, but it is not restricted thereto. The flash cell area A may be an embedded charge trap (eCT) area, a silicon storage technology (SST) area, a silicon-oxide-nitride-oxide-silicon (SONOS) area or etc. Isolation structures 10 are formed in the substrate 110 to isolate each areas including the flash cell area A, the high voltage N-type MOS transistor area B1, the high voltage P-type MOS transistor area B2, the core N-type MOS transistor area C1 and the core P-type MOS transistor area C2 from each other. The isolation structures 10 may be shallow trench isolation (STI) structures, which may be formed by a shallow trench isolation (STI) process, but it is not limited thereto. Doping processes may be performed in the substrate 110 to form doped regions in the substrate 110 such as doped regions 2/3/4/5/6/7. In this case, the doped regions 2/3/4 are formed in the substrate 110 of the flash cell area A, the doped regions 5/7 are formed in the substrate 110 of the high voltage N-type MOS transistor area B1, and the doped regions 6/7 are formed in the substrate 110 of the high voltage P-type MOS transistor area B2. For example, the doped region 2 may be an embedded isolation doped region to prevent circuit leakage above the embedded isolation doped region from flowing downwards, the doped regions 3 may be cell source junction implant regions, the doped region 4 may be a selective gate threshold voltage implant region, the doped region 5 may be a standard high voltage P-well, the doped region 6 may be a standard high voltage N-well, and the doped regions 7 may be standard high voltage low threshold voltage implant regions, but it is not limited thereto.

A pattern G1 is formed on the substrate 110 of the flash cell area A, and a stacked structure G2 is formed on the substrate 110 of the core area C. The pattern G1 may be gates or fins etc. In this embodiment, the cell area A is a memory cell area, so that the pattern G1 is gates of flash cells, but it is not limited thereto. In a preferred embodiment, the pattern G1 and the stacked structure G2 include common materials and are formed at the same time. Thus, the pattern G1 and the stacked structure G2 are constituted by one same ONO dielectric layer 12, one same electrode layer 14 serving as control gates in the flash cell area A, one same first hard mask layer 16 and one same second hard mask layer 18 stacked from bottom to top, but it is not limited thereto. Methods of forming the pattern G1 and the stacked structure G2 may include sequentially depositing and then patterning these layers. In one case, a lower oxide layer of the ONO dielectric layer 12 may extend to cover the whole substrate 110, the same electrode layer 14 may be a doped polysilicon layer with a thickness of 400 angstroms, the first hard mask layer 16 may be an oxide layer with a thickness of 250 angstroms and the second hard mask layer 18 may be an undoped polysilicon layer with a thickness of 600 angstroms. Spacers 20 may be formed beside the pattern G1 (each of the gates), wherein each of the spacers 20 is a dual spacer including an inner spacer 22 and an outer spacer 24, and the inner spacer 22 may be an oxide spacer while the outer spacer 24 may be a nitride spacer, but it is not limited thereto. In other cases, the spacer 20 may be one single spacer or a multilayer spacer.

Figure 2:
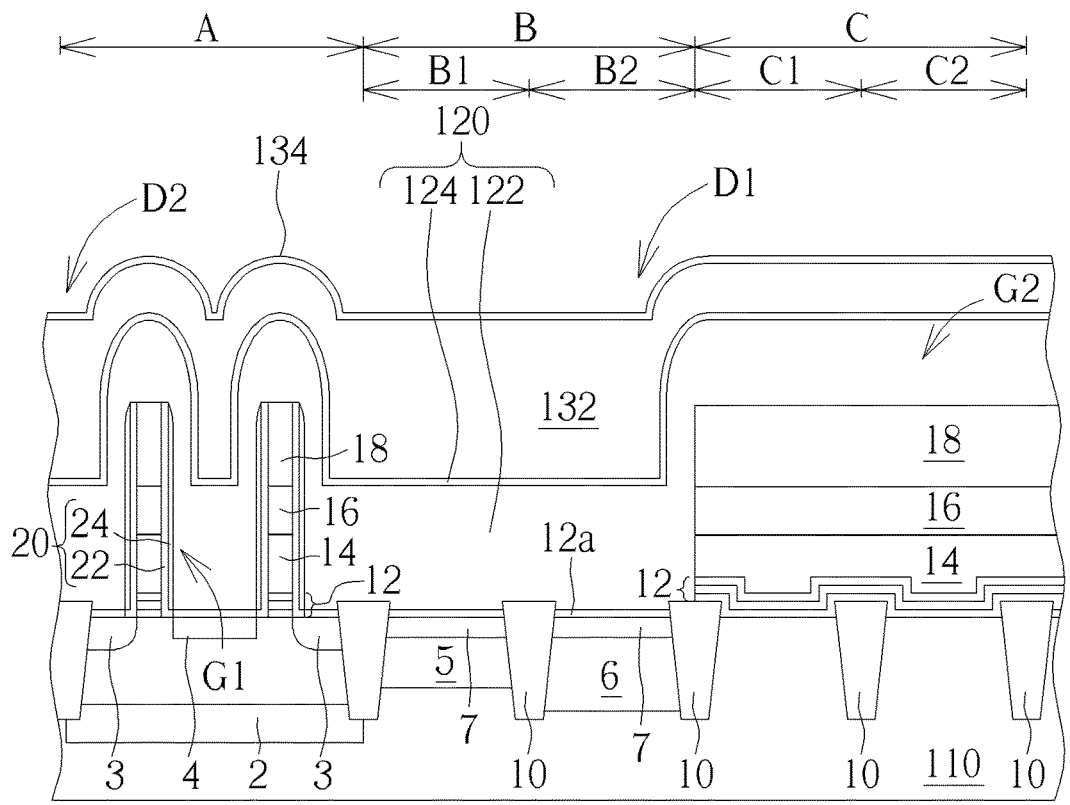
FIG. 2 schematically depicts a cross-sectional view of a planarization process according to an embodiment of the present invention.

As shown in FIG. 2, a layer 120 may be optionally deposited to conformally cover the pattern G1, the stacked structure G2 and the substrate 110 in the cell area A, the isolation area B and the core area C. In this embodiment, the layer 120 may include a lower layer 122 and an upper layer 124, wherein the lower layer 122 may be a polysilicon layer such as a doped polysilicon layer while the upper layer 124 may be a nitride layer, but it is not limited thereto. The upper layer 124 serves as an etch stop layer, so that a thickness of the lower layer 122 is preferably much thicker than a thickness of the upper layer 124. For instance, the thickness of the lower layer 122 is 900 angstroms while the thickness of the upper layer 124 is 120 angstroms, wherein the upper layer 124 may be preferably formed by an atomic layer deposition (ALD) process. The steps of forming the layer 120 may be skipped, and the following steps can be processed.

A first dielectric layer 132 and a second dielectric layer 134 may be sequentially formed to conformally cover the pattern G1, the stacked structure G2 and the substrate 110 in the cell area A, the isolation area B and the core area C. Thereby, the first dielectric layer 132 and the second dielectric layer 134 have a dishing D1 in the isolation area B and dishings D2 in the cell area A. In this case, the first dielectric layer 132 may be an oxide layer while the second dielectric layer 134 may be a nitride layer for having removing selectivity in later removing processes, but it is not limited thereto. In other cases, the first dielectric layer 132 and the second dielectric layer 134 may be other material layers for having removing selectivity. The second dielectric layer 134 serves as an etch stop layer, so that a thickness of the first dielectric layer 132 is preferably much thicker than a thickness of the second dielectric layer 134. For instance, the thickness of the first dielectric layer 132 is 1300 angstroms, which may be formed by a high density plasma (HDP) deposition process, while the thickness of the second dielectric layer 134 is 180 angstroms, which may be formed by an chemical vapor deposition (CVD) process.

Figure 3:
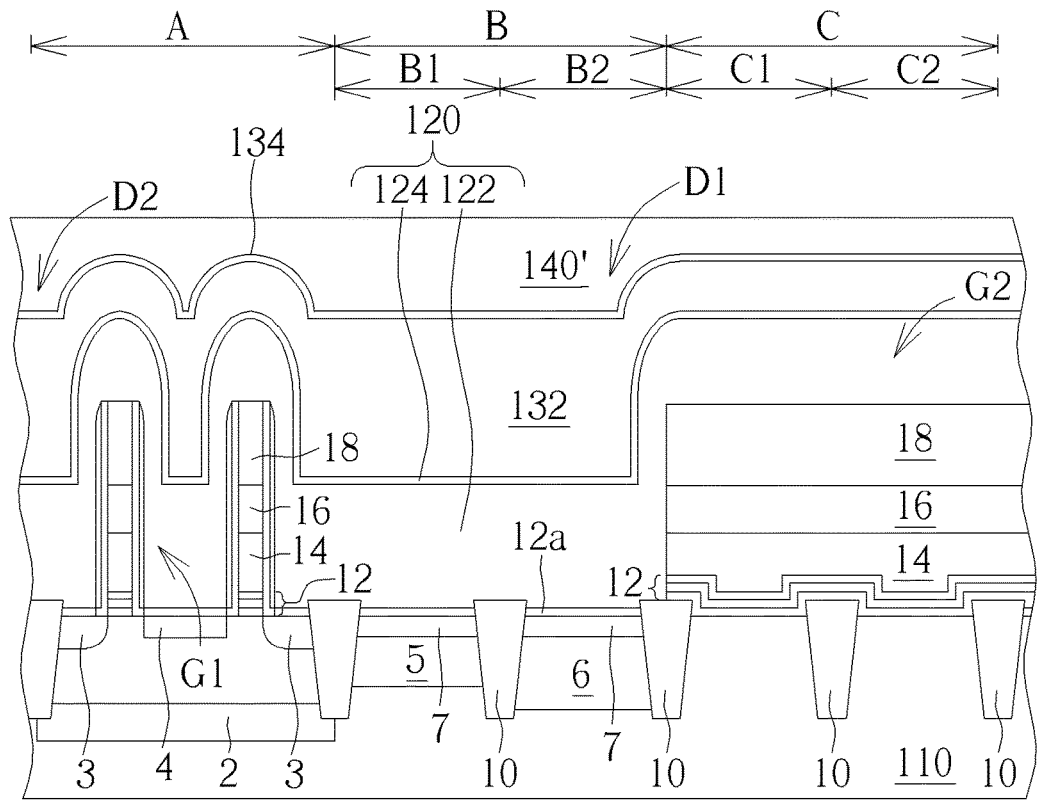
FIG. 3 schematically depicts a cross-sectional view of a planarization process according to an embodiment of the present invention.
Figure 4:
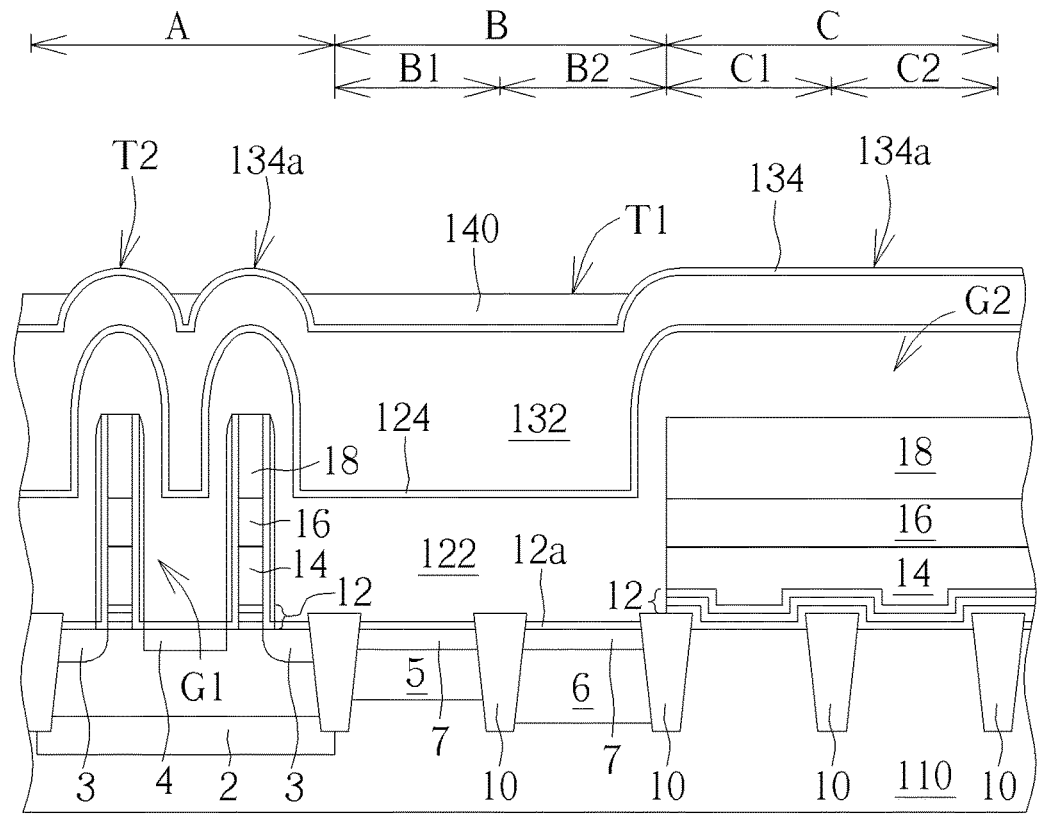
FIG. 4 schematically depicts a cross-sectional view of a planarization process according to an embodiment of the present invention.

Please refer to FIGS. 3-4, a dummy material 140 is formed in the dishings D1/D2 but exposes a part 134a of the second dielectric layer 134 right above the pattern G1. As shown in FIG. 3, a dummy material 140' may blanketly cover the second dielectric layer 134, wherein the dummy material 140' is preferably formed by coating to fill gaps on the second dielectric layer 134 and have a flat top surface of the dummy material 140'. The dummy material 140' may be a bottom anti-reflective-coating (BARC) layer, a photoresist, an organic dielectric layer (ODL), a spin-on-glass (SOG) layer or a spin-on-dielectric (SOD) layer etc. In this embodiment, the dummy material 140' is a bottom anti-reflective-coating (BARC) layer, but it is not limited thereto. As shown in FIG. 4, the dummy material 140' is then etched back, thereby a top surface T1 of the dummy material 140 being lower than a top surface T2 of the second dielectric layer 134.

Figure 5:
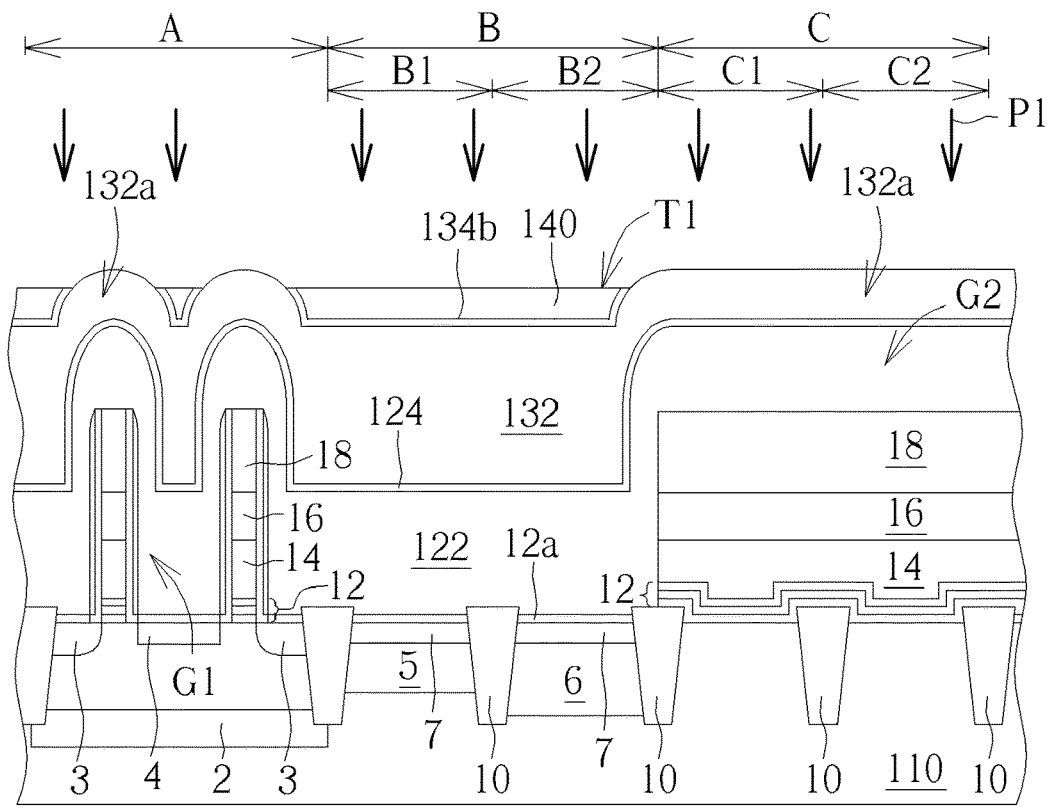
FIG. 5 schematically depicts a cross-sectional view of a planarization process according to an embodiment of the present invention.

Then, a first removing process P1 is performed to remove the exposed part 134a of the second dielectric layer 134, and thus from a second dielectric layer 134b and expose a part 132a of the first dielectric layer 132, as shown in FIG. 5. Preferably, the first removing process P1 is an etching process, wherein the removal rate of the first removing process P1 to the second dielectric layer 134 is higher than the removal rate of the first removing process P1 to the dummy material 140, and the removal rate of the first removing process P1 to the second dielectric layer 134 is higher than the removal rate of the first removing process P1 to the first dielectric layer 132, to only remove the exposed part 134a of the second dielectric layer 134, but reserve the first dielectric layer 132 and the dummy material 140.

Figure 6:
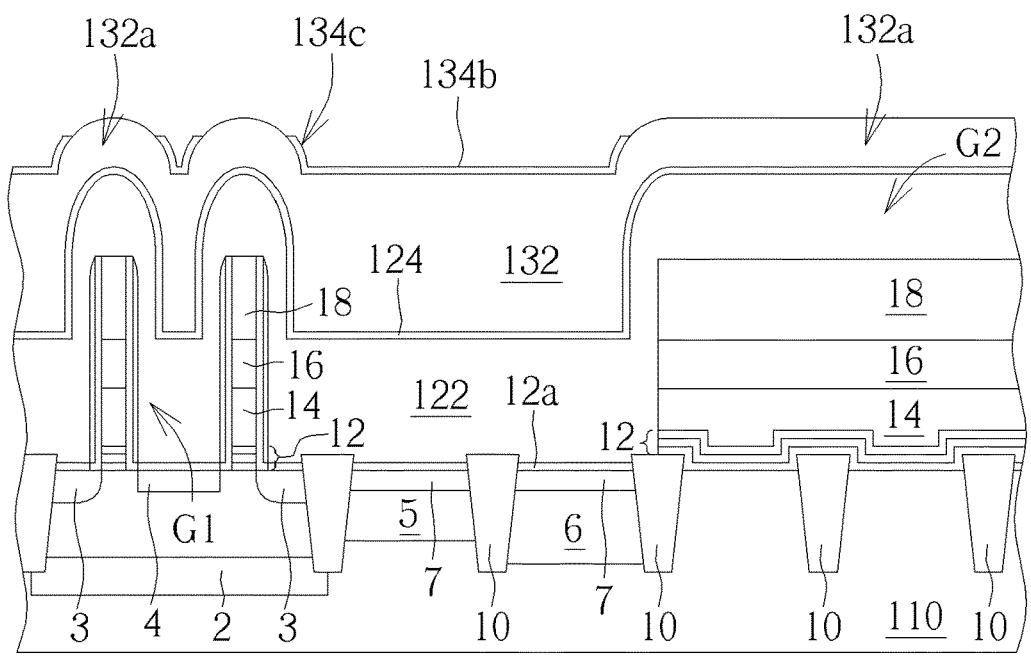
FIG. 6 schematically depicts a cross-sectional view of a planarization process according to an embodiment of the present invention.
Figure 7:
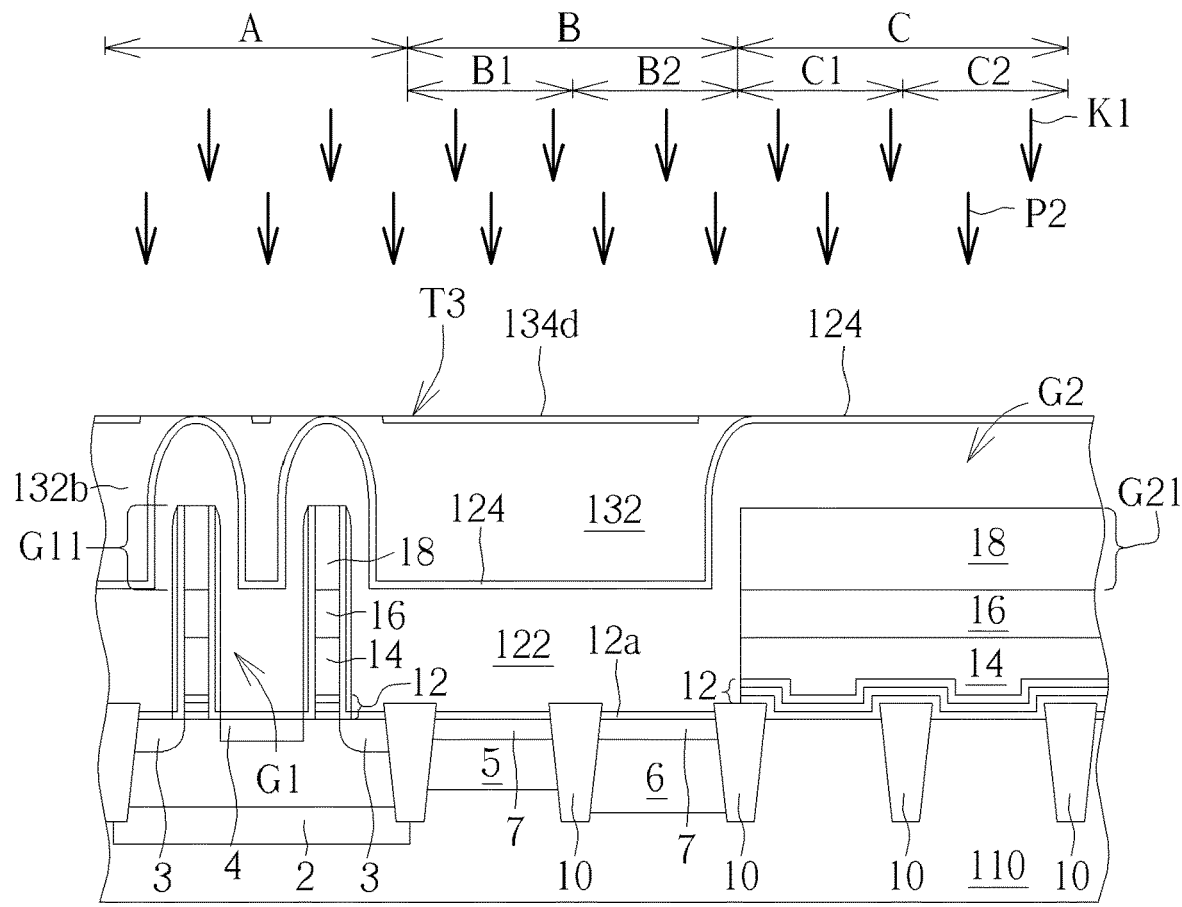
FIG. 7 schematically depicts a cross-sectional view of a planarization process according to an embodiment of the present invention.

The dummy material 140 is then removed to expose the part 132a of the first dielectric layer 132 as well as the second dielectric layer 134b, as shown in FIG. 6. Thereafter, a second removing process P2 is performed to remove the exposed part 132a of the first dielectric layer 132 by using the second dielectric layer 134b in the isolation area B as an etch stop layer, therefore the part 132a of the first dielectric layer 132 can being removed, and a first dielectric layer 132b can being formed, as shown in FIG. 7. A part 134c of the second dielectric layer 134b covering the part 132a of the first dielectric layer 132 may also be removed and a second dielectric layer 134d may be formed optionally. Preferably, the second removing process P2 is a polishing process, and the removal rate of the second removing process P2 to the first dielectric layer 132 is higher than the removal rate of the second removing process P2 to the second dielectric layer 134b, to form a flat top surface T3 constituted by the first dielectric layer 132b, the second dielectric layer 134d and the upper layer 124. A cleaning process K1 may be performed to clean residues such as polymer remaining after the second removing process P2 is performed.

Accordingly, the flat top surface T3 can be obtained by forming the dummy material 140 to fill the dishings D1/D2, removing exposed parts (meaning the part 134a of the second dielectric layer 134), removing the dummy material 140, and then removing protruding parts (meaning the part 132a of the first dielectric layer 132).

Figure 8:
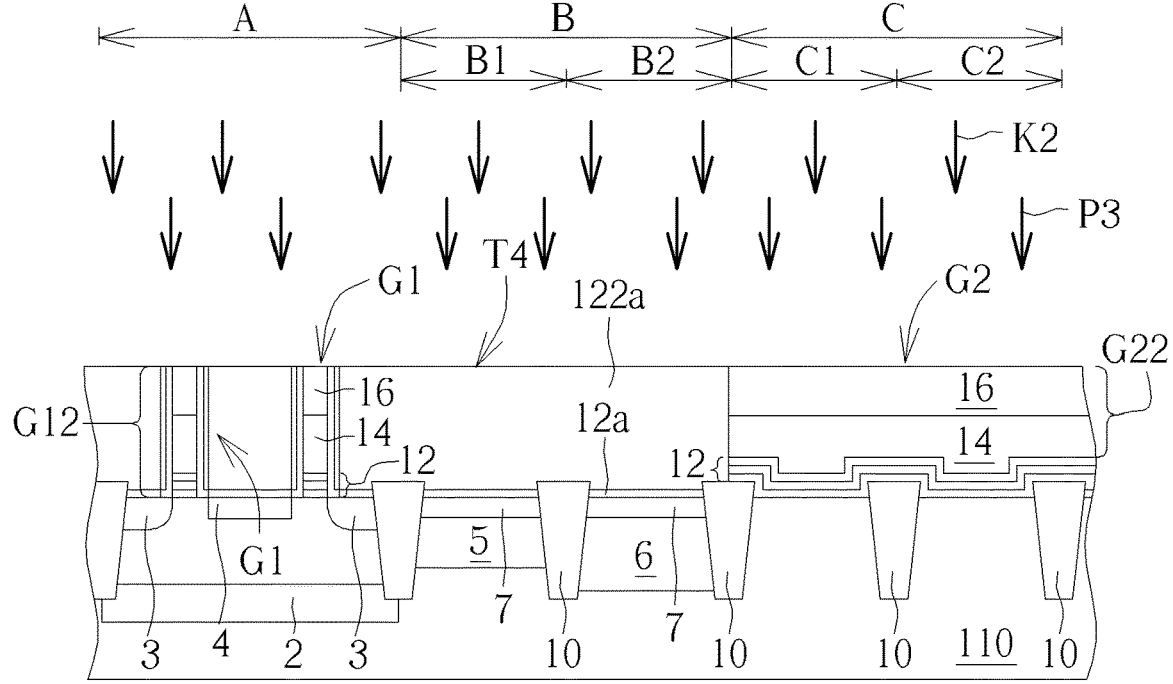
FIG. 8 schematically depicts a cross-sectional view of a planarization process according to an embodiment of the present invention.

Then, a third removing process P3 is performed to remove the second dielectric layer 134d and the first dielectric layer 132b, as shown in FIG. 8. In this embodiment, the second dielectric layer 134d, the first dielectric layer 132b and the upper layer 124 are removed completely. Meanwhile, a top G11 of the pattern G1 and a top G21 of the stacked structure G2 are removed while the third removing process P3 is performed. Hence, a flat top surface T4 constituted by a bottom G12 of the pattern G1 and a bottom G22 of the stacked structure G2 and a lower layer 122a can be formed. Preferably, the third removing process P3 is an etching process or a polishing process, and the removal rate of the third removing process P3 to the first dielectric layer 132b is common to the removal rate of the third removing process P3 to the second dielectric layer 134d. A cleaning process K2 may be performed to clean residues such as polymer remaining after the third removing process P3 is performed.

Figure 9:
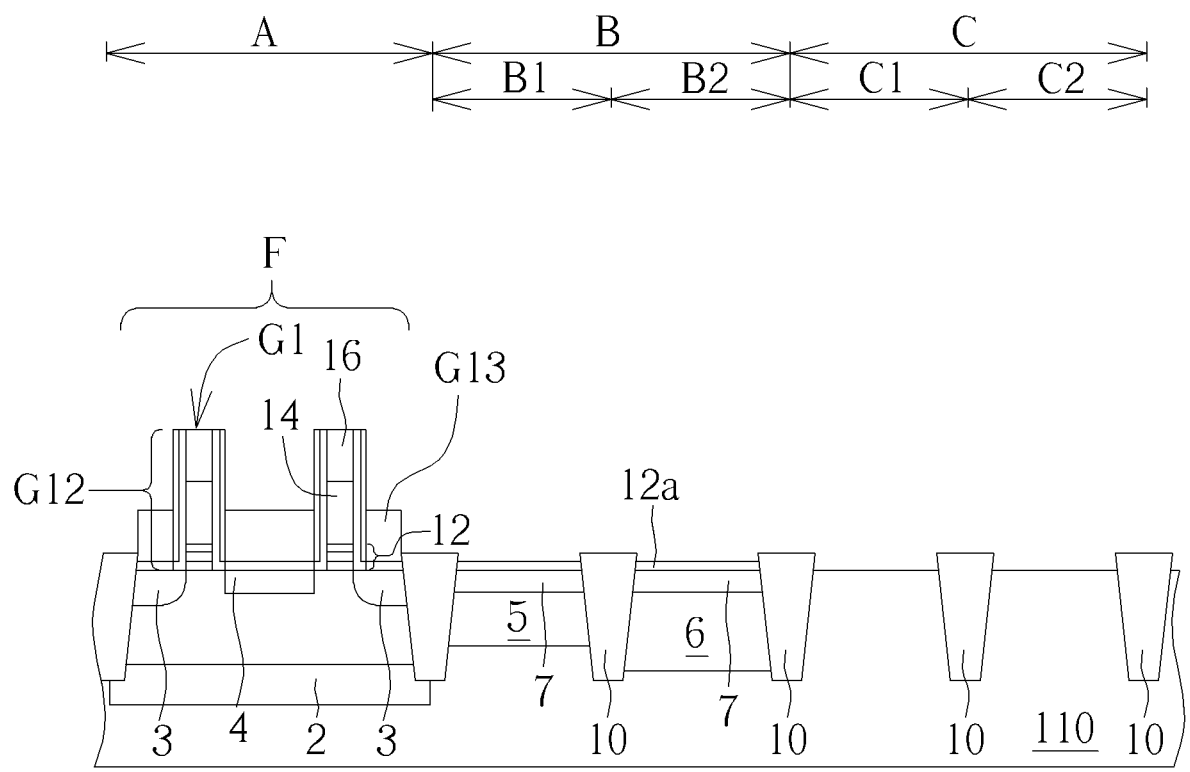
FIG. 9 schematically depicts a cross-sectional view of a planarization process according to an embodiment of the present invention.

Thereafter, the bottom G22 of the stacked structure G2 may be removed and the lower layer 122a may be partially (or completely) removed, as shown in FIG. 9. In this case, the lower layer 122a may be partially removed (patterned) to form selective gates G13 beside the bottom G12 of the pattern G1. In another case, the lower layer 122a may be completely removed and then selective gates G13 beside the bottom G12 of the pattern G1 may be formed by depositing and patterning processes. Thereby, flash cells F can be carried out, but it is not limited thereto. Transistors in the core area C can be formed in later processes.

To summarize, the present invention provides a planarization process, which sequentially forms a first dielectric layer and a second dielectric layer conformally covering a pattern on a substrate in a cell area and the substrate in the cell area and an isolation area, thereby the first dielectric layer and the second dielectric layer inherently having a dishing in the isolation area; forms a dummy material in the dishing and exposing a part of the second dielectric layer right above the pattern; performs a first removing process to remove the exposed part of the second dielectric layer and thus expose a part of the first dielectric layer; removes the dummy material; performs a second removing process to remove the exposed part of the first dielectric layer by using the second dielectric layer as an etch stop layer, therefore a flat top surface constituted by said layers can being formed. Then, a third removing process can be performed to remove top parts of these layers such as the second dielectric layer and the first dielectric layer, to form a lower flat top surface. By doing this, the planarization process of present invention can obtain a flat top surface by utilizing the dummy material filling into the dishing.

Moreover, the dummy material may be formed by coating to fill gaps and have a flat top surface, wherein the dummy material may preferably include a bottom anti-reflective-coating (BARC) layer, a photoresist, an organic dielectric layer (ODL), a spin-on-glass (SOG) layer or a spin-on-dielectric (SOD) layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A planarization process, comprising:
providing a substrate comprising a cell area and an isolation area;
forming a pattern on the substrate of the cell area;
sequentially forming a first dielectric layer and a second dielectric layer conformally covering the pattern and the substrate in the cell area and the isolation area, thereby the first dielectric layer and the second dielectric layer having a dishing in the isolation area;
forming a dummy material in the dishing and exposing a part of the second dielectric layer right above the pattern;
performing a first removing process to remove the exposed part of the second dielectric layer and thus expose a part of the first dielectric layer;
removing the dummy material;
performing a second removing process to remove the exposed part of the first dielectric layer by using the second dielectric layer in the isolation area as an etch stop layer; and
performing a third removing process to remove the second dielectric layer and the first dielectric layer.

2. The planarization process according to claim 1, wherein the pattern comprises gates or fins.

3. The planarization process according to claim 2, wherein the cell area comprises a memory cell area, and the pattern comprises gates of flash cells.

4. The planarization process according to claim 1, wherein the dummy material is formed by coating.

5. The planarization process according to claim 4, wherein the dummy material comprises a bottom anti-reflective-coating (BARC) layer, a photoresist, an organic dielectric layer (ODL), a spin-on-glass (SOG) layer or a spin-on-dielectric (SOD) layer.

6. The planarization process according to claim 5, wherein the step of forming the dummy material comprises coating and then etching back the bottom anti-reflective-coating (BARC) layer, thereby a top surface of the bottom anti-reflective-coating (BARC) layer being lower than a top surface of the second dielectric layer.

7. The planarization process according to claim 1, wherein the first removing process is an etching process, and the removal rate of the first removing process to the second dielectric layer is higher than the removal rate of the first removing process to the dummy material.

8. The planarization process according to claim 7, wherein the removal rate of the first removing process to the second dielectric layer is higher than the removal rate of the first removing process to the first dielectric layer.

9. The planarization process according to claim 1, wherein the first dielectric layer comprises an oxide layer while the second dielectric layer comprises a nitride layer.

10. The planarization process according to claim 1, wherein the second removing process is a polishing process, and the removal rate of the second removing process to the first dielectric layer is higher than the removal rate of the second removing process to the second dielectric layer.

11. The planarization process according to claim 1, wherein the third removing process is an etching process or a polishing process, and the removal rate of the third removing process to the first dielectric layer is common to the removal rate of the third removing process to the second dielectric layer.

12. The planarization process according to claim 1, wherein a top part of the pattern is removed while the third removing process is performed.

13. The planarization process according to claim 1, further comprising:
depositing a layer conformally covering the pattern and the substrate in the cell area and the isolation area before the first dielectric layer and the second dielectric layer are sequentially formed.

14. The planarization process according to claim 13, wherein the second dielectric layer and the first dielectric layer are removed completely while the third removing process is performed.

15. The planarization process according to claim 13, wherein the layer comprises a polysilicon layer.

16. The planarization process according to claim 15, further comprising:
performing a cleaning process after the second removing process or/and the third removing process is performed.

17. The planarization process according to claim 1, wherein the substrate comprises a core area, and a stacked structure is on the substrate of the core area.

18. The planarization process according to claim 17, wherein the stacked structure and the pattern comprise common materials and are formed at the same time.

19. The planarization process according to claim 18, wherein the stacked structure and the pattern comprise a doped polysilicon layer, an oxide layer and an undoped polysilicon layer stacked from bottom to top.

20. The planarization process according to claim 18, wherein a top part of the pattern and a top part of the stacked structure are removed while the third removing process is performed.

* * * * *